(12) United States Patent
Levitchi

(10) Patent No.: US 11,334,699 B1
(45) Date of Patent: May 17, 2022

(54) SCALABLE ELECTROMAGNETIC DETECTION SYSTEM AND 3D VISUALIZATION

(71) Applicant: Julian Levitchi, Huntsville, AL (US)

(72) Inventor: Julian Levitchi, Huntsville, AL (US)

( * ) Notice: Subject to any disclaimer, the term of this patent is extended or adjusted under 35 U.S.C. 154(b) by 258 days.

(21) Appl. No.: 16/590,875

(22) Filed: Oct. 2, 2019

Related U.S. Application Data

(60) Provisional application No. 62/740,381, filed on Oct. 2, 2018.

(51) Int. Cl.
| | |
|---|---|
| *G06F 30/34* | (2020.01) |
| *H04L 12/10* | (2006.01) |
| *G06F 30/20* | (2020.01) |

(52) U.S. Cl.
CPC .............. *G06F 30/34* (2020.01); *G06F 30/20* (2020.01); *H04L 12/10* (2013.01)

(58) Field of Classification Search
CPC ............. H01L 27/14643; H01L 25/167; H04L 12/911; H04L 12/10; H01Q 1/22; G01R 23/02; G06K 9/20; G01T 1/185; G06F 30/34; G06F 30/20
See application file for complete search history.

(56) References Cited

U.S. PATENT DOCUMENTS

| | | | | |
|---|---|---|---|---|
| 2008/0219599 | A1* | 9/2008 | Hopkins | H04N 5/23225 382/312 |
| 2011/0202163 | A1* | 8/2011 | Kim | G21D 3/04 700/110 |
| 2016/0380912 | A1* | 12/2016 | Burger | G06F 9/5044 709/226 |
| 2017/0350991 | A1* | 12/2017 | Friedman | G01T 1/2935 |
| 2018/0313877 | A1* | 11/2018 | Brant | H01Q 1/36 |
| 2018/0316082 | A1* | 11/2018 | Keller, III | H01Q 3/02 |

OTHER PUBLICATIONS

Zin et al. Characterisation of Regional Variations in a Stitched CMOS Active Pixel Sensor Nuclear Instruments and Methods in Physics Research A 620, 2010, pp. 540-548 (Year: 2010).*
Reference Tian et al. Design of an Electromagnetic Imaging System for Weapon Detection Based on GMR Sensor Arrays Sensors and Actuators A 174, 2012, pp. 75-84 (Year: 2012).*
Balaguer et al. Low-Cost Single Pix Imaging by Using an LED Array Optics Express 15623 vol. 26, No. 12, Jun. 11, 2018 (Year: 2018).*

* cited by examiner

*Primary Examiner* — Justin C Mikowski
*Assistant Examiner* — Cuong V Luu
(74) *Attorney, Agent, or Firm* — Babcock Legal Services

(57) ABSTRACT

An electromagnetic frequency visualization system has a mobile device platform with panels having multiple tiles with ARRAY cards having RF pixel sensors thereon. A software program interprets and displays 2D and 3D RF pixel sensor data from the ARRAY cards.

6 Claims, 9 Drawing Sheets

SCALABLE ELECTROMAGNETIC DETECTION SYSTEM AND 3D VISUALIZATION

CROSS-REFERENCE TO RELATED APPLICATIONS

This Non-provisional Application claims priority to provisional patent application 62/740,381 filed Oct. 2, 2018.

STATEMENT REGARDING FEDERALLY SPONSORED RESEARCH

Not Applicable

FIELD OF THE INVENTION

The invention relates to EMF detection and methods and systems for detecting and diagnosing EMF, EMI and RF emissions by means of digital visualization from a fixed or mobile perspective.

BACKGROUND OF THE INVENTION

The electronics industry has relied on many indicators to measure antenna x performance in communication devices such as cellular phones, PDA's, laptop computers and WIFI transceivers, radars etc. These indicators can include Effective Isotropic Radiated Power (EIRP), Effective Radiated Power (ERP), radiation patterns, directivity, radio frequency (RF) currents, far field and near field distributions. Many communication devices undergo routine calibrations to ensure proper RF power outputs to maintain proper signal connections and to maintain battery life. Such calibrations often consist of tests using individual sensors inside stationary, anechoic chambers and can be time consuming.

There is a need for a technology and technique to scan and locate frequencies for calibration testing that incorporates both 2D and 3D visualization techniques with a mobile platform for both near and far field frequency detection using thousands of sensors, all synchronized and all in real-time. The instant invention described herein provides this needed technology and technique.

The art referred to and/or described within this application is not intended to constitute an admission that any patent, publication or other information referred to herein is "prior art" with respect to this invention. In addition, this section should not be construed to mean that a search has been made or that no other pertinent information as defined in 37 C.F.R. § 1.56(a) exists.

All US patents and applications and all other published documents mentioned anywhere in this application are incorporated herein by reference in their entirety.

Without limiting the scope of the invention a brief summary of some of the claimed embodiments of the invention is set forth below. Additional details of the summarized embodiments of the invention and/or additional embodiments of the invention may be found in the Detailed Description of the Invention below.

A brief abstract of the technical disclosure in the specification is provided as well only for the purposes of complying with 37 C.F.R. 1.72. The abstract is not intended to be used for interpreting the scope of the claims.

BRIEF SUMMARY OF THE INVENTION

The device herein disclosed and described provides a solution for the stated need through the disclosure of a method and system for electromagnetic detection system with tiles and 2D and 3D visualization. An object of the invention is to provide a means to detect RF emissions from communication components from a vast_number of locations. The invention includes a panel comprised of numerous 'tiles' each having thousands of 'RF pixel' sensors connected to a Field Programmable Gate Array (FPGA) card. In some instances, these tiles can number into the hundreds or thousands. In some embodiments, the panels are 19'×19'. In some embodiments, they are larger in one or more directions with dimensions up to 100'. And in some embodiments, larger still. Of course, the panels can also be much smaller for some applications. These panels can be positioned in stationary locations around a component for both near and far field scanning purposes and display and detect RFs and EMFs in real time and display 2D or 3D images.

Another object of the invention is to provide a means to visualize RF emissions in 3D. The panels can also be mounted on a mobile structure and capture RFs and EMFs at various distances away from a component. This mobility also allows the device to capture slices of an emission, verify directivity and display levels in 3D. 3D imagery allows a user to understand details of an RF emission on a component in order to see if it is within specification or if corrections to a design needs to be made by engineers. This capability means less time to market, reduced research and development costs, and reduced time spent on compliance testing.

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

BRIEF DESCRIPTION OF THE SEVERAL VIEWS OF THE DRAWING(S)

The accompanying drawings, which are incorporated herein and form a part of the specification, illustrate some, but not the only or exclusive, examples of embodiments and/or features.

Other aspects of the present invention shall be more readily understood when considered in conjunction with the accompanying drawings, and the following detailed description, neither of which should be considered limiting.

DETAILED DESCRIPTION OF THE INVENTION

While this invention may be embodied in many different forms, there are described in detail herein specific preferred embodiments of the invention. This description is an exemplification of the principles of the invention and is not intended to limit the invention to the particular embodiments illustrated.

Figure 1:
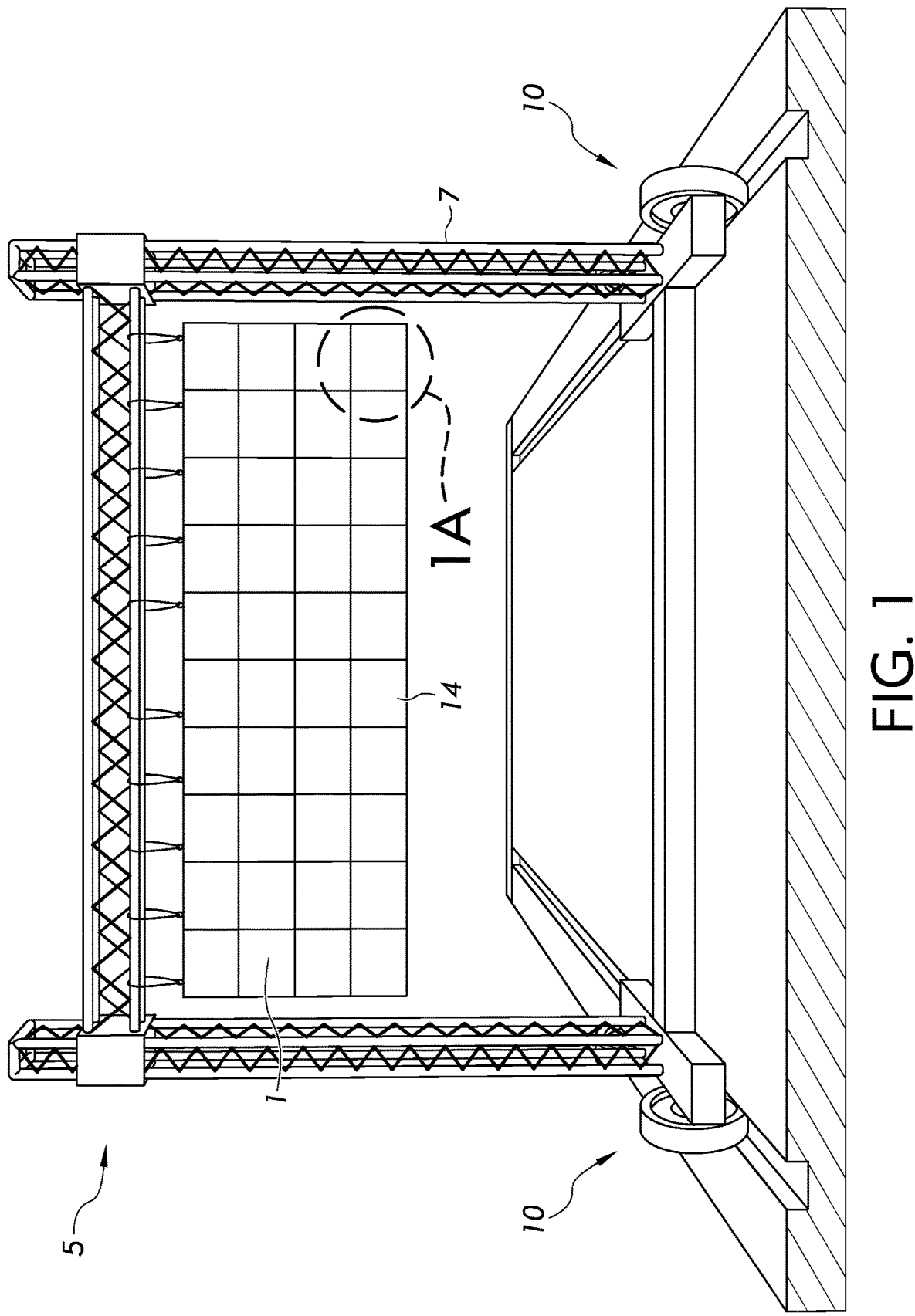
FIG. 1 shows a perspective view of an embodiment of the invention on a mobile platform.
Figure 1A:
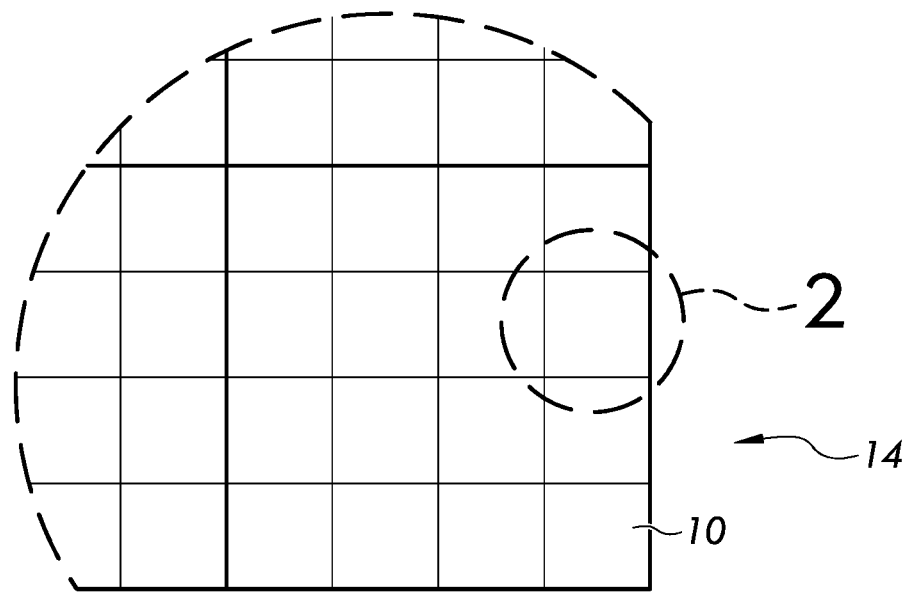
FIG. 1A shows a detailed front view of a tile of a panel.

FIG. 1 shows a perspective view of an embodiment of the invention having panel 1 configured selectively hanging from a mobile platform 5 having a superstructure 7 with wheels 10 and a track 12. As shown, the panel 1 being a rectangular, planar shape and made of a rigid material such as, but not limited to, plastic, metal and the like. The panel in some embodiments may have a non-rectangular shape, an irregular shape, or other shapes. Additionally, in some embodiments the panel may have a non-planar shape. Said panel 1 having a plurality of tiles 14. Said panel 1 is designed to detect near and far field EMF and RF emissions from electrical components or RF sources. The figure shows tile 14 within said panel 1. Said tile 14 is comprised of a multitude of interconnected FPGA cards 10. Each tile 14 can comprise thousands of rf pixels. FIG. 1A illustrates a detailed and magnified view of a tile 14 as illustrated on the panel 1 of FIG. 1.

Figure 2:
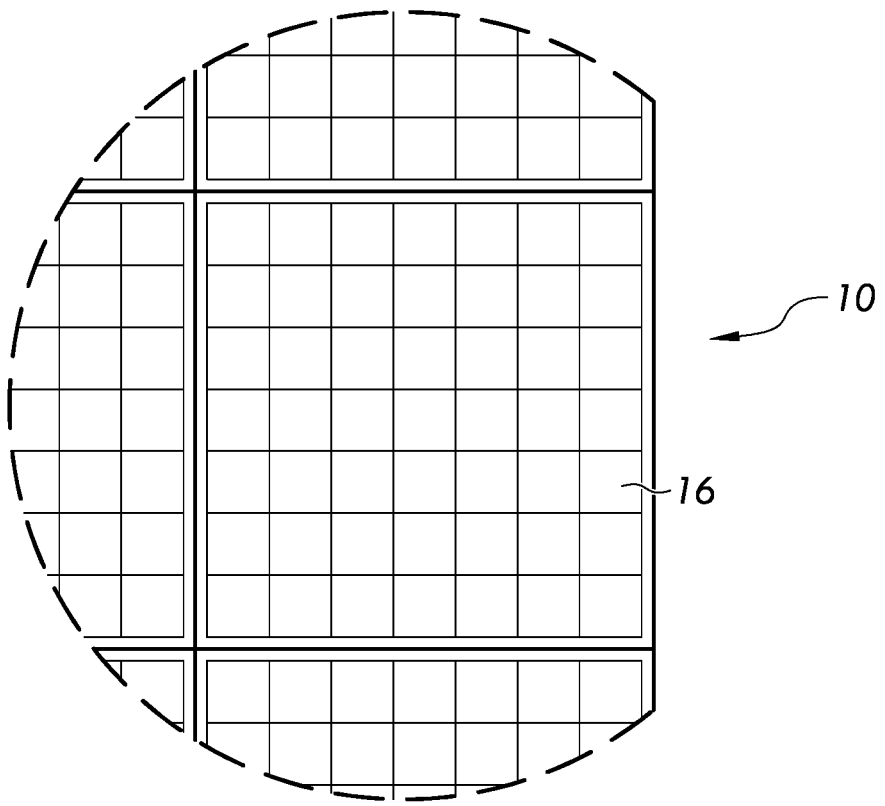
FIG. 2 shows a front view of the FPGA card.

FIG. 2 illustrates a close-up view of an FPGA card 10 being rectangular in shape with a plurality of 'RF Pixel' sensors 16 thereon to detect rf emissions and the like when directed at an electrical component being measured. The aforementioned RF Pixel sensors 16 comprised of, but not limited to both near and far broadband, active, passive, isotropic sensors and the like.

Figure 3:
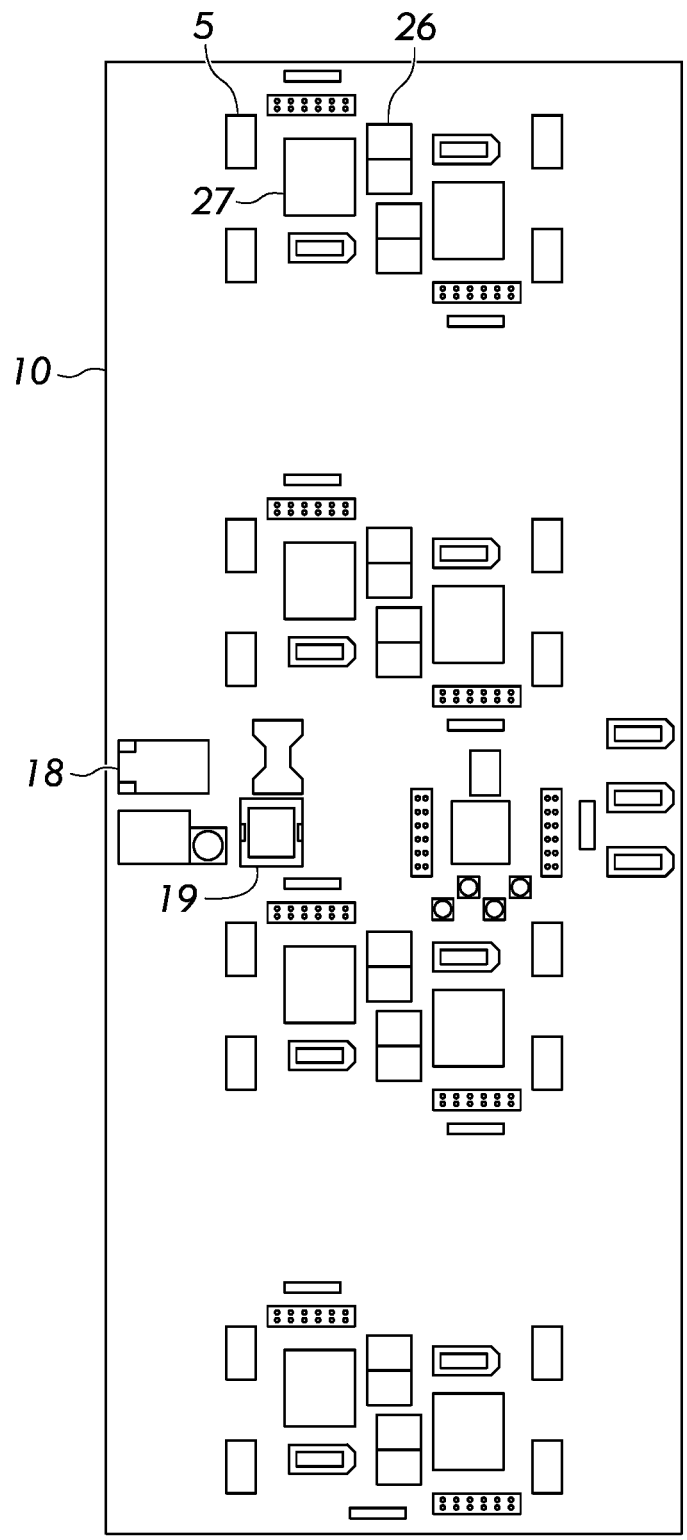
FIG. 3 shows a rear view of the FPGA card.

FIG. 3 illustrates a rear view of an embodied FPGA card 10 having electricity being supplied by a Power Over Ethernet (POE) port 18 or a power supply. Components of said tile may include but are not limited to, fpga, controller chipset 19, firmware 27, onboard memory 26. The dedicated RF signal path for each sensor coming from the RF Pixel sensors 16 enabling simultaneous digitization of all array elements, all synchronized.

Figure 4:
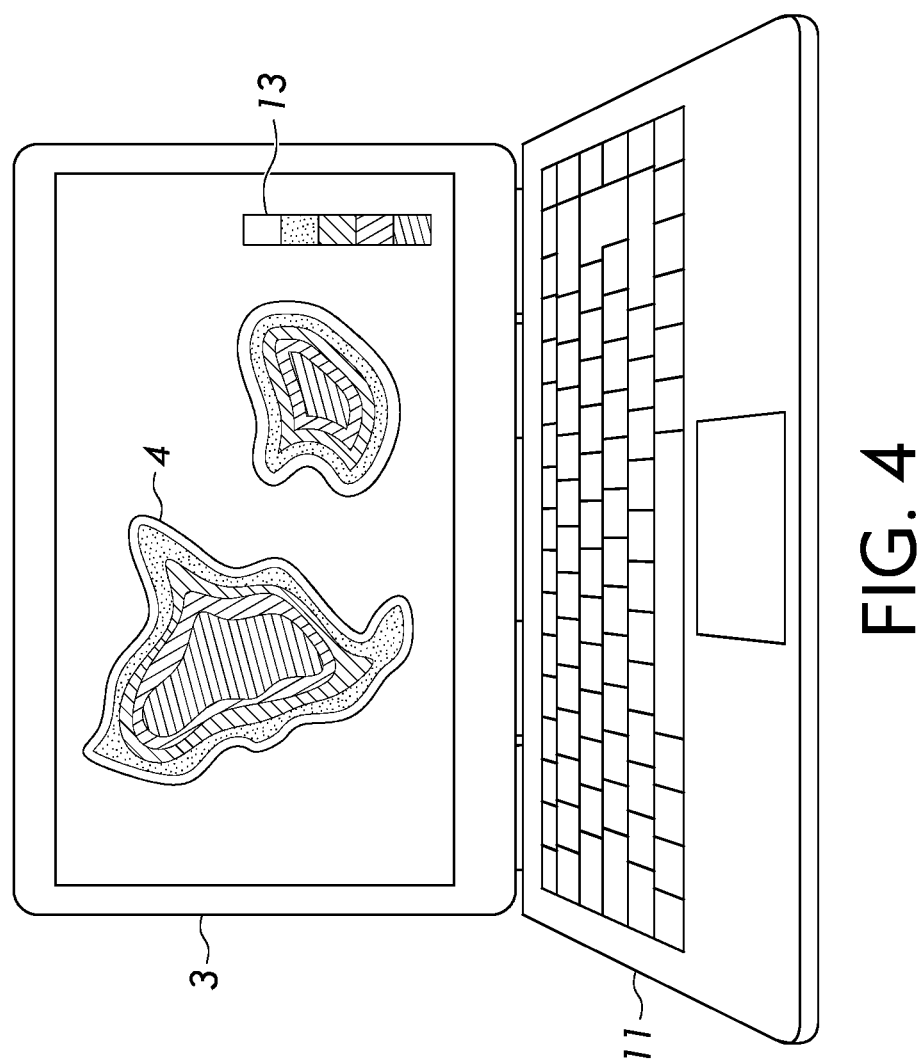
FIG. 4 shows emissions represented in a graphical form using the software.

FIG. 4 illustrates an embodiment of the invention being connected to a computer 3 by means of an Ethernet cable 11. The illustrated embodiment of invention also comprised of software 4 displaying results of RF emissions graphically on a screen using various colors according to a predetermined scale 13. The aforementioned invention software 4 being written from code that may include, but not be limited to: C #, Java™, C++™, Visual Basic™, Fortran™, Basic™ xxx/xxx/xxx/xxx and the like. The software also compatible with a plurality of operating systems such as, but not limited to: Linux, Windows™ Apple™ and Android™, and compatible with a multitude of hardware platforms such as, but not limited to: personal desktops, laptops, tablets, smartphones and the like. Said RF and EMF emissions being displayed in three dimensions or animations when the aforementioned panel 1 is moved around an electrical component 2 at various locations. The 2d and 3D representations having animations that can be played back at selected speeds.

Figure 5:
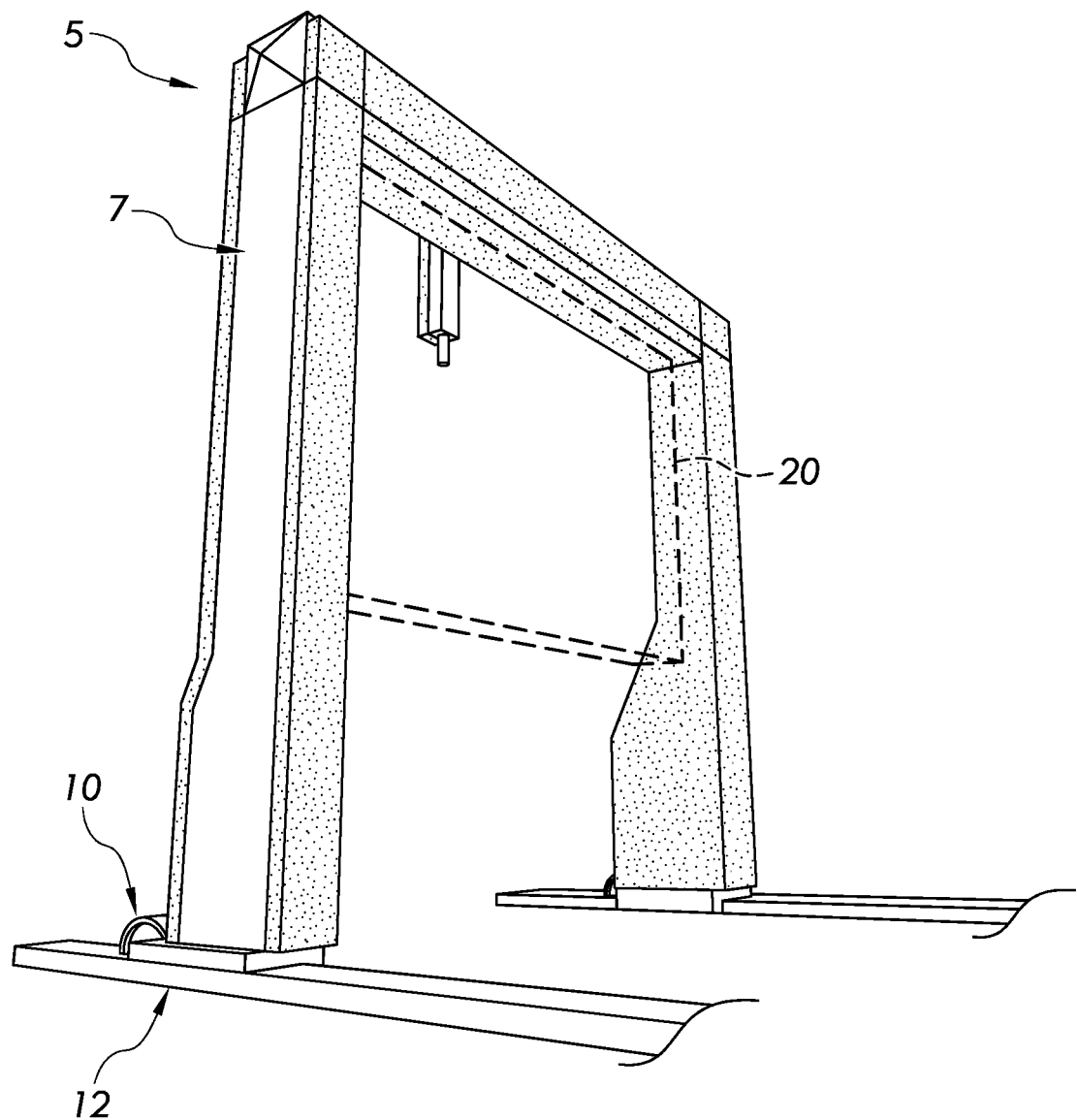
FIG. 5 shows a perspective view of a mobile platform.
Figure 6:
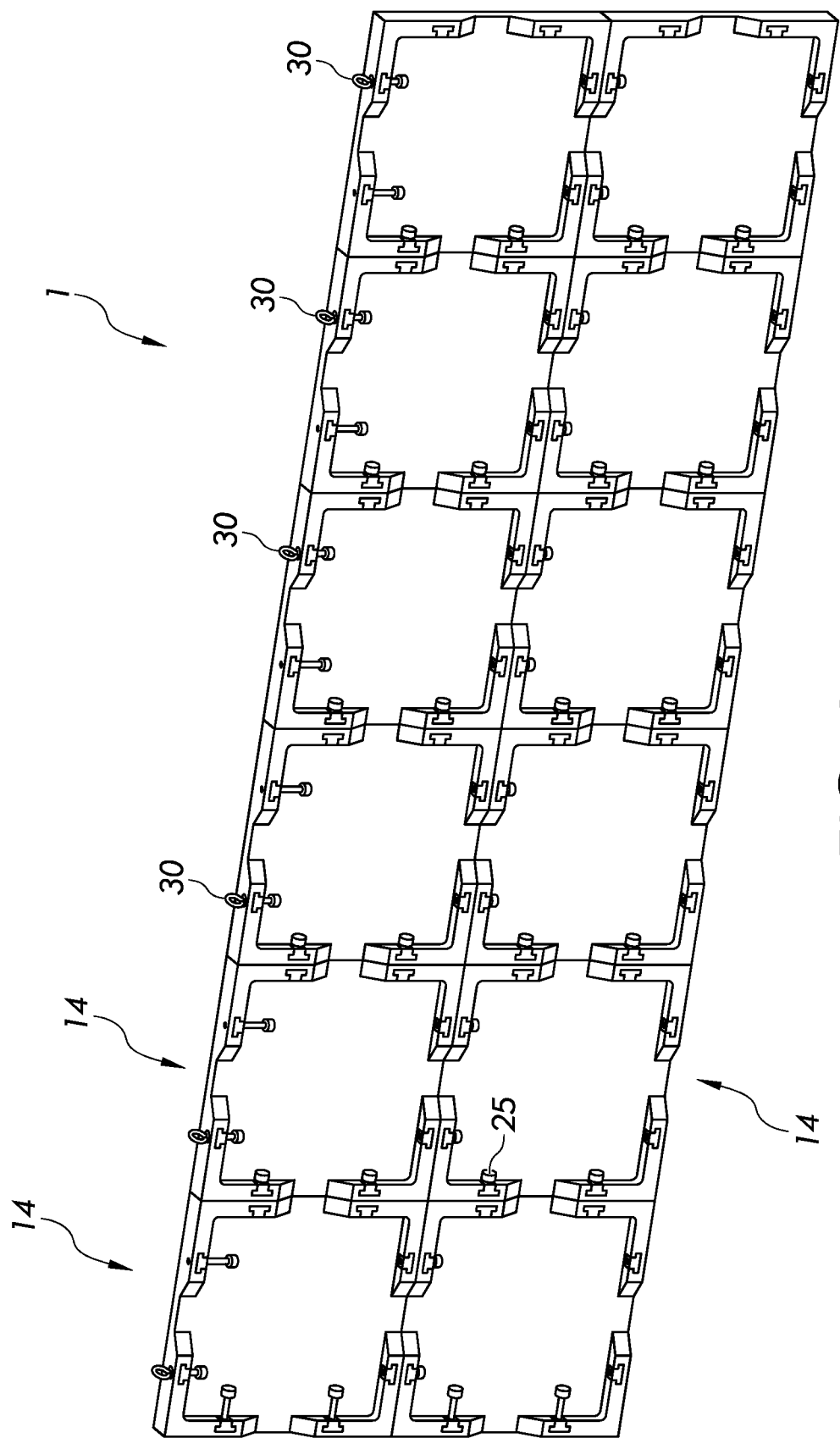
FIG. 6 shows a perspective back view of an embodied panel.
Figure 7:
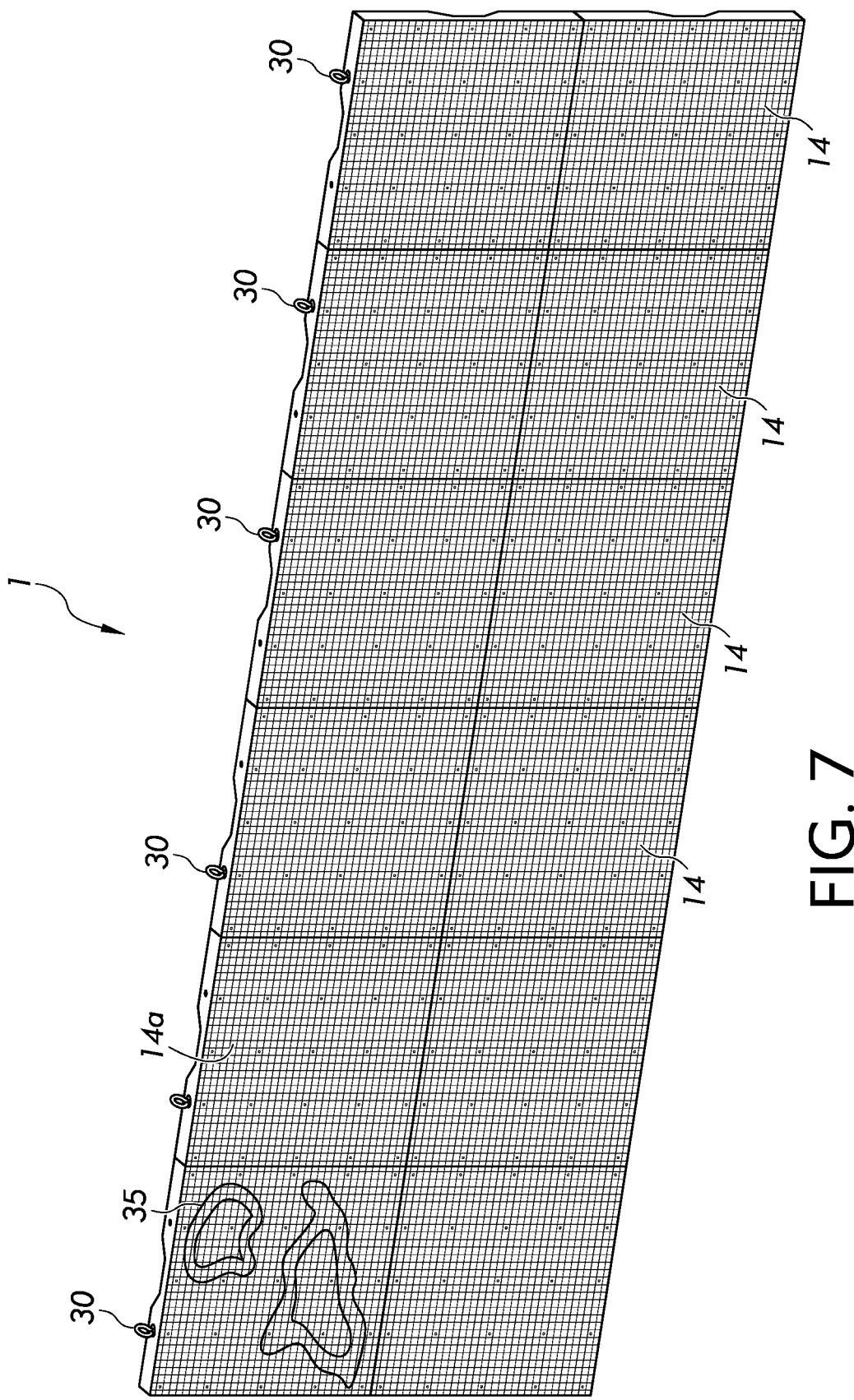
FIG. 7 shows a perspective front view of an embodied panel

FIG. 5 illustrates an embodiment of a mobile platform 5 designed for carrying a panel 1 (e.g. a panel as shown in FIGS. 1, 6, and 7). The mobile platform 5 can have a superstructure 7 with moving means 10 and a track 12. As shown, a panel 1 can be disposed in the outlined space 20. Embodied panels 1 are shown in FIGS. 6-7. In FIGS. 6-7 a panel 1 is constructed of multiple tiles 14 that are connected together by tile connectors 25. While any number of connection means are considered, some examples are screw, dove-tail, bolt. The panel 1 is constructed such that at least one or multiple of the tile(s) 14 have one or more connection means 30 to attach to the structure 7 of the mobile platform 5. In some embodiments one or more eyebolts are attached to the panel 1 to form a connection with the structure 7. The panel 1 can be of multiple shapes and is shown here as rectangular and planar. A rigid material such as, but not limited to, plastic, metal and the like is preferable in some applications however less rigid material can also be used.

Figure 9:
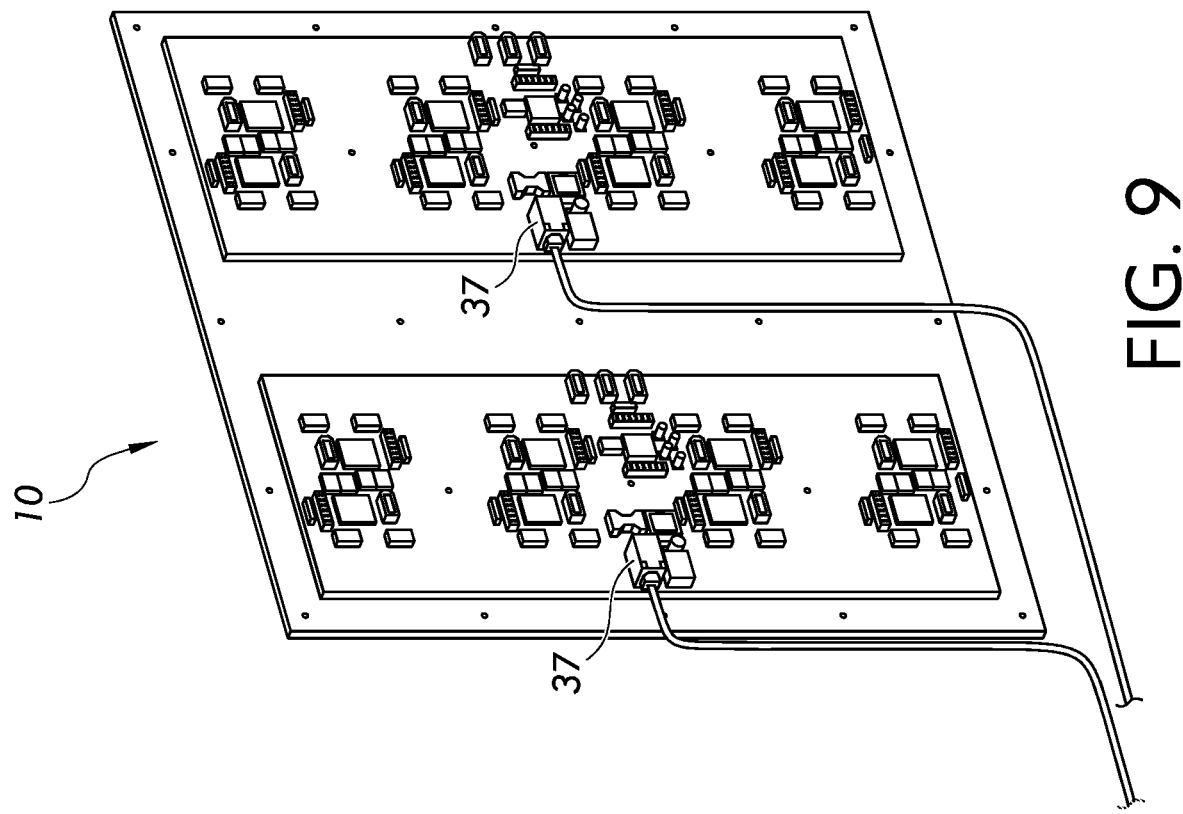
FIGS. 8-10 show a perspective back view of an embodied FPGA card.
Figure 8:
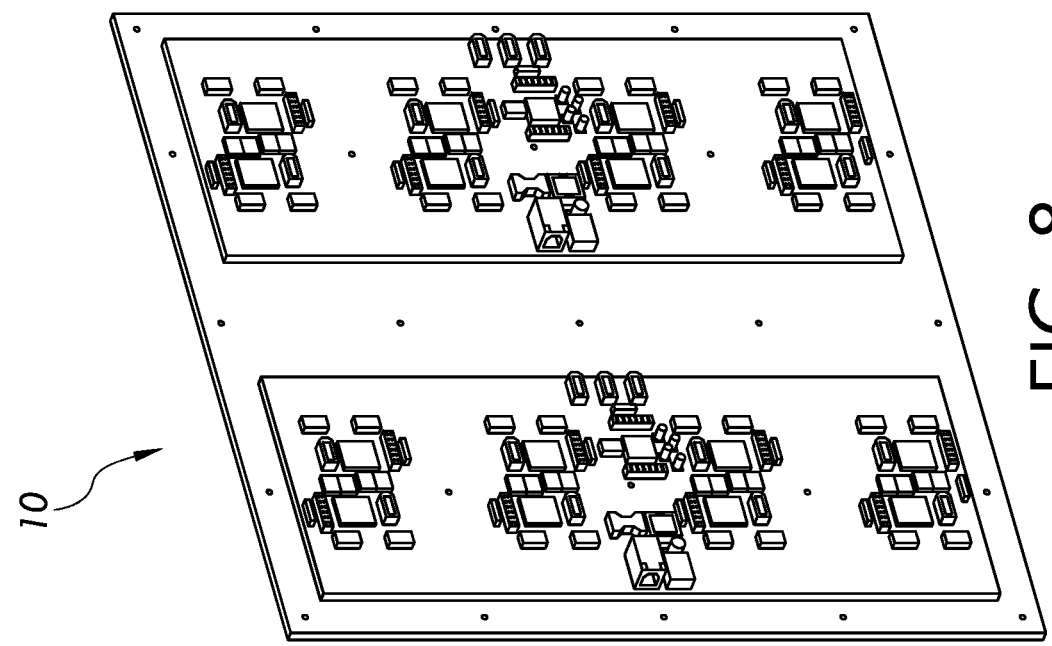
Figure 10:
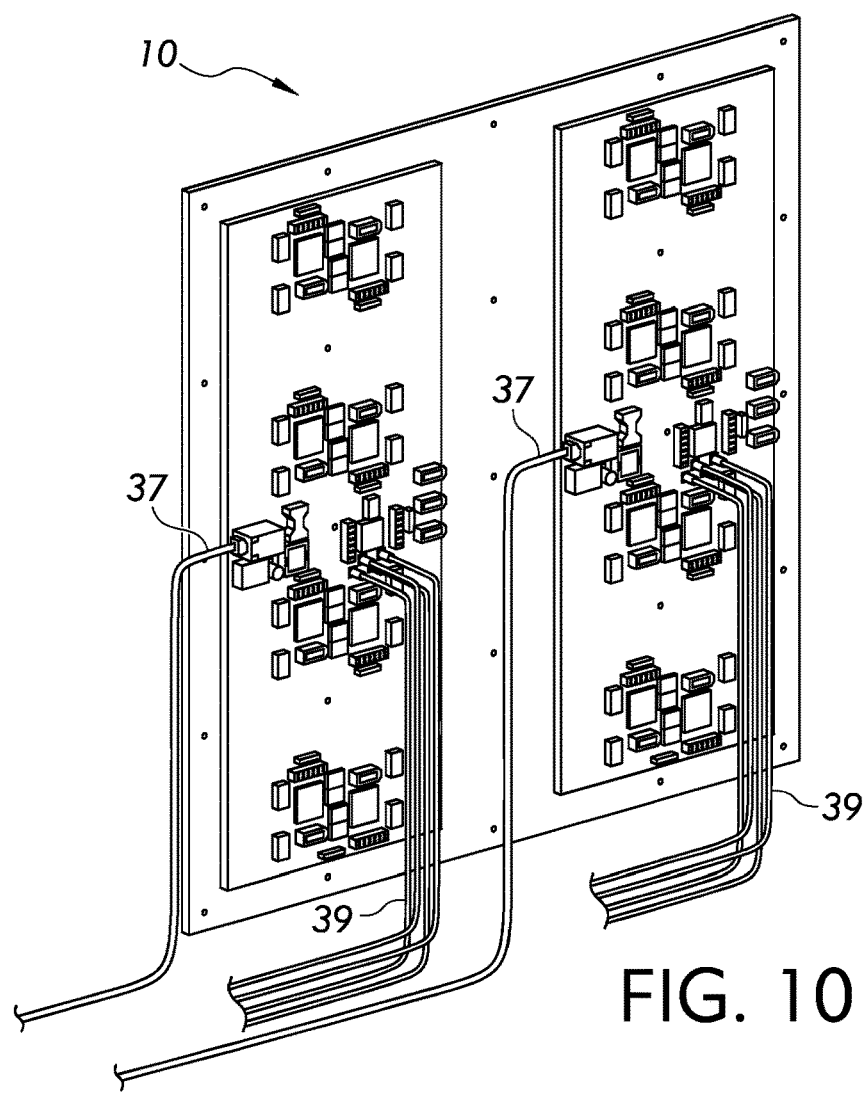
Figure 11:
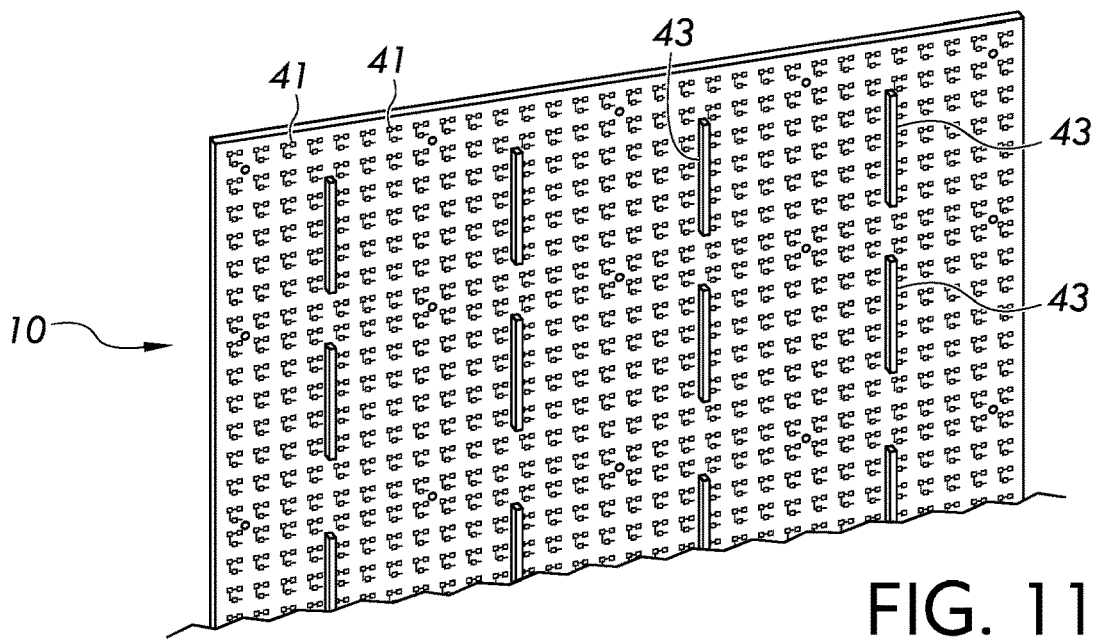
FIG. 11 shows a perspective front view of an embodied FPGA card.

In FIG. 7 the front of the panel 1 is shown. As shown in this illustration, twelve tiles 14 are shown with six across and two down. The tiles 14 are made of a large array of FPGA cards 10 (Field-programmable gate array card). These cards are shown in greater detail in FIGS. 8-11 where FIG. 11 is a front view and FIGS. 8-10 are back views. Printed circuit boards (PCBs) may be used in building the FPGA cards. As shown in FIG. 7 an image 35 of an EMF and/or RF distribution can be displayed on one tile 14. In some embodiments it may be expanded into multiple tiles 14. FIGS. 8-10 illustrate Power over Ethernet (POE) ports 37 that can be used to provide a data feed as well as provide power to the FPGA card 10. In some embodiments no other outside power source is necessary. Each FPGA card can connect to a switch or a hub for connectivity and data feed through the port 37. In some embodiments, the hub is connected to a computer (linux/pc/ios etc).

Round SMA connectors can attach to "sync generator" and feeds/syncs all displays to make 1 image. Multiple PCBs can be connected to one another. In FIG. 11 the front of a FPGA card 10 is shown. Here the red/blue/green pixels 41 are shown in an array on the card 10.

The above disclosure is intended to be illustrative and not exhaustive. This description will suggest many variations and alternatives to one of ordinary skill in this art. The various elements shown in the individual Figures and described above may be combined or modified for combination as desired. All these alternatives and variations are intended to be included within the scope of the claims where the term "comprising" means "including, but not limited to".

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

The invention claimed is:

1. An electromagnetic frequency visualization system, comprising:
   a) panels with multiple tiles configured to accept a plurality of ARRAY cards having a multitude of RF pixel sensors thereon;
   b) a mobile device platform configured to accommodate said panels;

c) a software program to interpret and display 2d and 3d RF pixel sensor data;

d) a FPGA with a multitude of sensor types, including but not limited to: near and far broadband, active, passive, and isotropic.

2. The system of claim 1 wherein the panel tiles have the capability of being interconnected to form tiles with an array of FPGA cards therein.

3. The system of claim 1 wherein the software displays emission data in both two and three dimensions as well as animations.

4. The system of claim 1 wherein the tiles can be built to accommodate various shapes of the measurement system.

5. The system of claim 1 wherein each tile has dedicated processing boards that receive electricity via interconnected Power over Ethernet (POE) jacks or power supplies.

6. The system of claim 1 wherein the software displays emission data in both two and three dimensions as well as recordings.

\* \* \* \* \*